US009169930B2

(12) United States Patent
Panchal et al.

(10) Patent No.: US 9,169,930 B2
(45) Date of Patent: Oct. 27, 2015

(54) HIGH TEMPERATURE SEAL ASSEMBLY

(71) Applicant: METALLIC HI TEMPERATURE SEAL SYSTEMS, LLC., Whittier, CA (US)

(72) Inventors: Dashrath M. Panchal, West Covina, CA (US); Richard Wall, Whittier, CA (US)

(73) Assignee: Metallic Hi Temperature Seal Systems, LLC, Whittier, CA (US)

( * ) Notice: Subject to any disclaimer, the term of this patent is extended or adjusted under 35 U.S.C. 154(b) by 37 days.

(21) Appl. No.: 14/070,326

(22) Filed: Nov. 1, 2013

(65) Prior Publication Data

US 2014/0125014 A1    May 8, 2014

Related U.S. Application Data

(60) Provisional application No. 61/721,657, filed on Nov. 2, 2012.

(51) Int. Cl.
*F16J 15/32* (2006.01)
*F16J 15/08* (2006.01)
(Continued)

(52) U.S. Cl.
CPC ............ *F16J 15/3284* (2013.01); *F01D 9/023* (2013.01); *F01D 11/005* (2013.01); *F16F 1/187* (2013.01); *F16J 15/0887* (2013.01); *F16J 15/3292* (2013.01); *H05K 9/0016* (2013.01); *Y10T 29/49826* (2015.01)

(58) Field of Classification Search
CPC . F16J 15/0887; F16J 15/3288; F16J 15/3292; F01D 9/023; F01D 11/005; H05K 9/0016; F16F 1/027; F16F 1/18; F16F 1/187
See application file for complete search history.

(56) References Cited

U.S. PATENT DOCUMENTS 3,589,070 A * 6/1971 Hansen ..................... 49/483.1
3,869,222 A * 3/1975 Rahnke et al. ............ 415/134

(Continued)

FOREIGN PATENT DOCUMENTS

JP    2008-249093    10/2008
JP    2010-276184    12/2010

OTHER PUBLICATIONS

International Search Report on related PCT Application No. PCT/US2013/068144 from International Searching Authority (KIPO) dated Aug. 14, 2014.

*Primary Examiner* — Kristina Fulton
*Assistant Examiner* — Nicholas L Foster
(74) *Attorney, Agent, or Firm* — Klein, O'Neill & Singh, LLP

(57) ABSTRACT

A seal assembly includes a semi-tubular sealing element defining a longitudinal axis, and a retainer configured to retain the sealing element. The sealing element has a longitudinal center portion and first and second longitudinal side portions, an array of resilient arcuate fingers extending from the first longitudinal side portion and curving partially around the longitudinal axis, and a depressor portion extending from the second longitudinal side portion and having a free edge diametrically opposed to the center portion. The retainer defines a channel with an entrance opening, the channel being configured to receive the sealing element in a position in which the depressor portion extends outside of the entrance opening in position to bear a load, the channel being defined by a pair of opposed side walls configured to resiliently capture the sealing element.

34 Claims, 5 Drawing Sheets

(51) Int. Cl.
  *F01D 9/02*   (2006.01)
  *F01D 11/00*  (2006.01)
  *F16F 1/18*   (2006.01)
  *H05K 9/00*   (2006.01)

(56) References Cited

U.S. PATENT DOCUMENTS

| | | | | |
|---|---|---|---|---|
| 4,133,542 A | * | 1/1979 | Janian et al. | 277/555 |
| 4,572,921 A | * | 2/1986 | May et al. | 174/355 |
| 4,602,888 A | * | 7/1986 | Court et al. | 403/28 |
| 4,817,337 A | * | 4/1989 | Lahita | 49/483.1 |
| 5,158,305 A | * | 10/1992 | Halling | 277/591 |
| 5,806,899 A | | 9/1998 | Norikawa et al. | |
| 6,093,887 A | * | 7/2000 | Ponto et al. | 174/377 |
| 6,161,838 A | | 12/2000 | Balsells | |
| 6,227,546 B1 | * | 5/2001 | Halling | 277/312 |
| 6,464,457 B1 | * | 10/2002 | Morgan et al. | 415/174.2 |
| 6,639,145 B1 | * | 10/2003 | Nurmi | 174/387 |
| 6,676,137 B2 | * | 1/2004 | Dean | 277/628 |
| 7,464,940 B2 | * | 12/2008 | Datta | 277/555 |
| 7,497,443 B1 | * | 3/2009 | Steinetz et al. | 277/644 |
| 7,784,264 B2 | * | 8/2010 | Weaver et al. | 60/39.37 |
| 7,938,407 B2 | * | 5/2011 | Datta et al. | 277/644 |
| 8,257,028 B2 | * | 9/2012 | Morgan et al. | 415/135 |
| 2005/0206097 A1 | * | 9/2005 | Datta | 277/644 |
| 2006/0032237 A1 | * | 2/2006 | Aumont et al. | 60/796 |
| 2009/0169370 A1 | * | 7/2009 | Morgan et al. | 415/174.2 |
| 2009/0178985 A1 | | 7/2009 | Sempliner et al. | |
| 2012/0200046 A1 | * | 8/2012 | Green et al. | 277/647 |
| 2012/0304657 A1 | * | 12/2012 | Melton et al. | 60/752 |
| 2013/0270777 A1 | * | 10/2013 | Clouse | 277/637 |

* cited by examiner

HIGH TEMPERATURE SEAL ASSEMBLY

CROSS-REFERENCE TO RELATED APPLICATION

This application claims priority, under 35 U.S.C. §119(e), from U.S. Provisional Application No. 61/721,657, filed Nov. 2, 2012, the disclosure of which is incorporated herein by reference in its entirety.

FEDERALLY-SPONSORED RESEARCH OR DEVELOPMENT

Not Applicable

BACKGROUND

The present disclosure relates to sealing devices. More specifically, it relates to a high-temperature seal assembly that includes a sealing element and a sealing element retainer.

High temperature seals in aerospace applications, such as for use inside jet engines, are most commonly made of elastomeric materials. However, the elastomeric materials are limited to a maximum operating temperature of about 260° C. (500° F.). These materials may also present challenges in obtaining safety certifications. For example, these materials may produce outgases and cause backside ignition—both of which constitute test failure. In addition, these elastomeric seals require a complex process to produce, with varying material usage and weights.

It would therefore be advantageous, and an advance in the state of the art, to provide a seal assembly that is capable of maintaining its structural integrity and sealing function at elevated temperatures, such as those encountered inside jet engines.

SUMMARY

Broadly, this disclosure relates to a seal assembly comprising a semi-tubular sealing element defining a longitudinal axis, wherein the sealing element includes a longitudinal center portion and first and second longitudinal side portions on opposite sides of the center portion, a linear array of resilient arcuate fingers on the first longitudinal side portion of the center portion and curving partially around the longitudinal axis, and a longitudinal depressor portion extending at an angle from the second longitudinal side portion so as to define a longitudinal free edge approximately diametrically opposed to the center portion; and a sealing element retainer defining a longitudinal channel with an entrance opening, the channel being configured to receive the sealing element in a position in which the depressor portion extends outside of the entrance opening, the channel being defined by a pair of opposed side walls configured to resiliently capture the sealing element.

By "semi-tubular" is meant a partially cylindrical shape that is less than a full circle in cross-section.

In one specific embodiment, the channel has a bottom wall and a cross-sectional width that decreases from the bottom wall to the entrance. The sealing element is configured to be retained in the channel, with the central portion attachable to the base, so that the depressor portion extends longitudinally outside the channel entrance so as to receive and bear a load from an adjoining structure.

In accordance with an aspect of the disclosure, a method of making a sealing assembly comprises (a) providing a sheet of high spring strength, high temperature metal alloy having first and second opposed side edges; (b) forming a semi-tubular sealing element by (1) forming a first portion of the sheet including the first side edge into a linear array of fingers, (2) bending the fingers partially around a longitudinal axis to form a linear array of arcuate fingers, and (3) forming a depressor portion by bending a second portion of the sheet including the second side edge toward the array of arcuate spring fingers so that the second side edge overlies the longitudinal axis and is spaced radially and circumferentially from the arcuate fingers; (c) providing a seal retainer comprising a base and a pair of opposed side walls extending from the base, the base and the side walls defining a channel configured to retain the sealing element; and (d) installing the sealing element into the channel with the depressor portion extending outside the channel.

DETAILED DESCRIPTION

Figure 1:
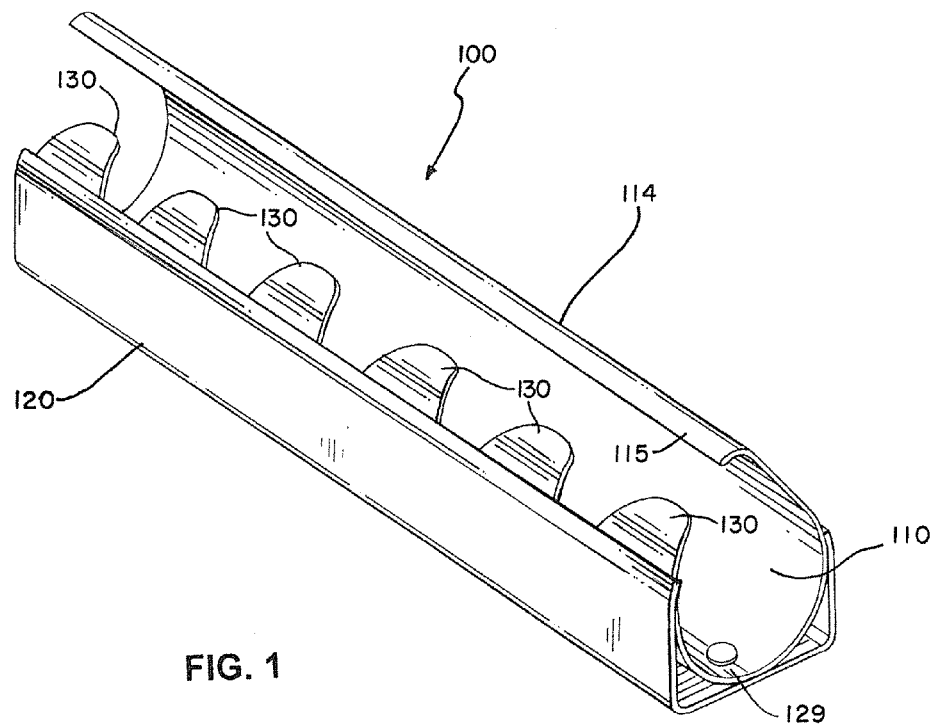
FIG. 1 is a top and front perspective view of a seal assembly in accordance with an embodiment of the present disclosure.

FIG. 1 illustrates a seal assembly 100 in accordance with an embodiment of the present disclosure. The seal assembly 100 includes a sealing element 110 configured to provide a gastight seal between structural elements (not shown). The sealing element 110 may be a high temperature seal or a fire seal, for example. In some embodiments, the sealing element 110 may be composed of a material suitable for use at operating temperatures in excess of 260° C. (500° F.). For example, in some embodiments the sealing element 110 may be made of a material suitable for use at operating temperatures of at least about 500° C. (900° F.). Typically, high spring-strength, high temperature metal alloys are suitable. One such alloy is the austenitic nickel-chromium superalloy marketed under the trademark INCONEL® 718 by Special Metals Corporation of New Hartford, N.Y.

The seal assembly 100 also includes a sealing element retainer 120 for securing and retaining the sealing element 110, retaining it in position, and controlling its deformation under stress. The retainer 120 may likewise be composed of a metal alloy material suitable for use at operating temperatures in excess of 260° C. (500° F.), such as INCONEL® 718, for example. Of course, other materials may be selected based on the operating requirements for a desired application. For example, in some embodiments, the retainer 120 may be stainless steel, such as 0.635 mm (0.025 in.) thick 321 stainless steel per AMS 5510.

The seal assembly 100 of this disclosure may be used in a variety of applications, including, but not limited to, aerospace, automotive, domestic and commercial applications.

For example, in some embodiments, the seal assembly 100 may be used as a gas-tight fire seal in a thrust reverser of a jet aircraft engine.

As shown in FIGS. 1, 2, 3, and 5, a sealing element 110 according to an embodiment of this disclosure, as mentioned above, is advantageously made from a unitary sheet of high temperature, high spring-strength metal alloy, such as INCONEL® 718, which is wrapped or otherwise formed into an axially-coiled, semi-tubular configuration. In some embodiments, the metal sheet may be an INCONEL® 718 sheet of about 0.4 mm (0.016 in.) in thickness, advantageously tempered per AMS 5699. Other alloys, sheet thicknesses, and tempering standards may be employed, depending on the specific application. In some embodiments, the metal sheet material may be selected to be within the elastic modulus range for the required operating temperature. For example, in an aerospace application, the metal sheet material may be selected to be within its elastic modulus range for operating temperatures of at least about 500° C. (900° F.). The size of the sealing element 110 may also selected according to the desired application. For example, in some embodiments, the sealing element 110 may have an outside diameter of approximately 25 mm (0.98 in.).

Figure 3:
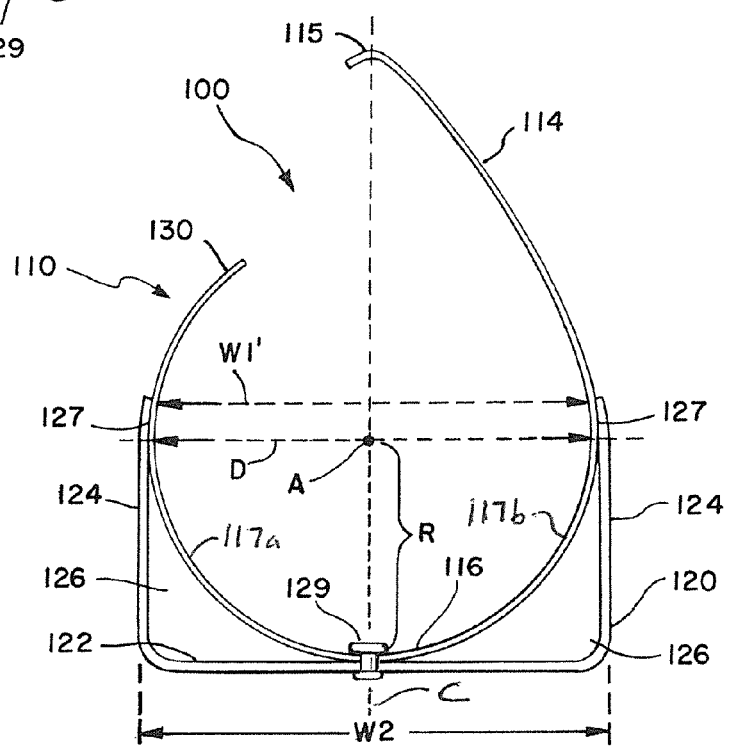
FIG. 3 is an end elevation view of the seal assembly of FIG. 1.
Figure 5:
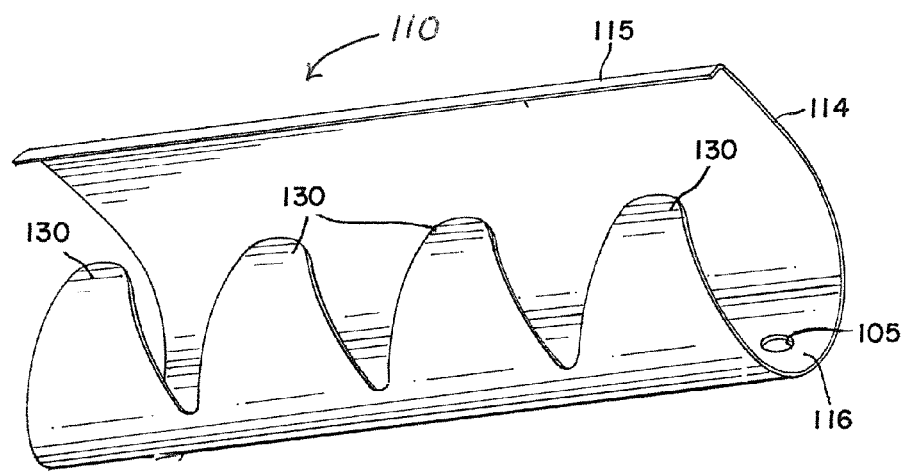
FIG. 5 is a front perspective view of a sealing element in accordance with the sealing assembly of FIG. 1.

Referring to FIG. 5, the sealing element 110 is a substantially semi-tubular (as defined above) member, defining a longitudinal axis A (perpendicular to the drawing sheet as shown in FIG. 3), that fits into the retainer 120, as described below. The sealing element 110 includes a longitudinal center portion 116 with first and second longitudinal side portions 117a, 117b, respectively, on opposite sides of the center portion 116 (FIG. 3). Disposed along the first longitudinal side 117a of the center portion 116 is a linear array of inwardly-curved resilient spring fingers 130 that extend from and are integral with the first longitudinal side portion 117a, and that curve partially around the axis A. The second longitudinal side portion 117b extends into an integral resilient load-bearing or depressor portion 114 that terminates in a free edge 115 which may be formed as a radially turned-in linear lip. The depressor portion 114 is bent toward the fingers 130 so that the free edge 115 overlies the axis A and is diametrically opposed to the center portion 116.

The center portion 116 is advantageously provided with a linear array of apertures 105, one of which is shown in FIG. 5. As will be described below, when the sealing element 110 is installed in the retainer 120, the sealing element apertures 105 align with registering apertures in the retainer 120 for the installation of fasteners that fix the sealing element 110 in the retainer 120.

As best shown in FIG. 3, the fingers 130 curve partially around the longitudinal axis A, defining a first radius of curvature, while the depressor portion 114 defines a second radius of curvature that is substantially greater than the first radius of curvature, whereby the depressor portion 114 may appear to be only very shallowly curved, or nearly flat. In some embodiments, the depressor portion 114 may, indeed, be flat or nearly so. In the illustrated embodiment, the fingers 130 define an arc that, when measured from a centerline C of the center portion 116, is less than 180°, preferably no more than about 135° to 160°, so that they terminate a significant circumferential distance short of underlying the free edge 115 of the depressor portion 114. Thus, the ends of the fingers 130 are separated from the free edge 115 of the depressor portion 114 both radially and circumferentially. In other embodiments, the ends of the fingers 130 may underlie the free edge 115 of the depressor portion 114; that is the ends of the fingers 130 may be approximately diametrically opposed to the center portion 116 of the sealing element 110. In other embodiments, the arc length of the fingers 130 may be sufficient to extend the ends of the fingers 130 a substantial distance past the free edge 115 of the depressor portion 114, so that there is considerable overlap between the depressor portion 114 and the fingers 130.

While the illustrated sealing element 110 is an embodiment having four more-or-less sinusoidal-shaped fingers 130, which are substantially equally spaced apart, the shape, number and position of the fingers 130 are exemplary, and not limiting. For example, the number, shape, and position of the fingers 130 may depend on the overall length of the sealing element 110, the expected loads that may be applied to it, and other environmental factors that may vary from application to application. For example, dimensions of the fingers 130 (particularly the arc length and the maximum width) may be selected in accordance with the desired stiffness of the seal assembly 100 as needed for a particular application. Specifically, the stiffness of the sealing element 110 is proportional to the maximum width of the fingers 130. For example, the maximum width of the fingers 130 may be increased to increase the stiffness of the sealing element 110, and the maximum width of the fingers 130 may be decreased to decrease the stiffness of the sealing element 110. In some embodiments, it may be advantageous to have fingers that vary in size and shape along the length of the sealing element 110.

The sealing element 110 may be formed, for example, from a sheet of a metal alloy (of the type, for example, described above) having a first edge that is cut into a scalloped configuration that, in some embodiments, may look somewhat sinusoidal. The scalloped edge thereby defines the linear array of fingers 130 that are curled or bent around the longitudinal axis A toward an opposite second edge of the sheet with the above-referenced first radius of curvature. The second edge is bent toward the fingers 130 so as to be separated from the ends of the fingers 130 by both a circumferential distance and a radial distance. The second edge thus defines the free edge 115 of the depressor portion 114.

The depressor portion 114 extends longitudinally along the length of the sealing element 110, and it is configured to receive a load or compression from an adjoining structure or device, primarily along the free edge 115 thereof. In some embodiments, a protective coating, such as a tungsten carbide plasma spray RA 150, for example, may be applied to the outer surface of the depressor portion 114 and other contact wear surfaces to provide wear resistant surfaces. When the sealing element 110 is installed within the retainer 120, as explained below, the depressor portion 114 extends outwardly from the retainer 120, with its free edge 115 preferably disposed in approximate diametric opposition to the center portion 116 of the sealing element 110, as shown in FIG. 3.

Figure 4A:
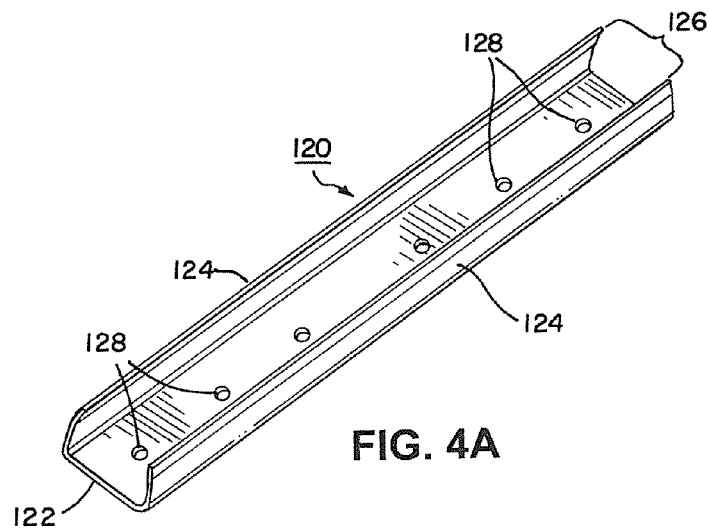
FIG. 4A is a top perspective view of a sealing element retainer in accordance with the sealing assembly of FIG. 1.
Figure 4B:
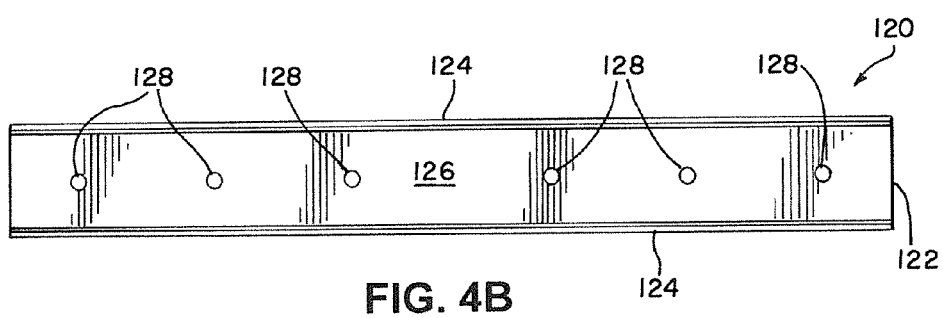
FIG. 4B is a top plan view of the retainer of FIG. 3A.
Figure 4C:
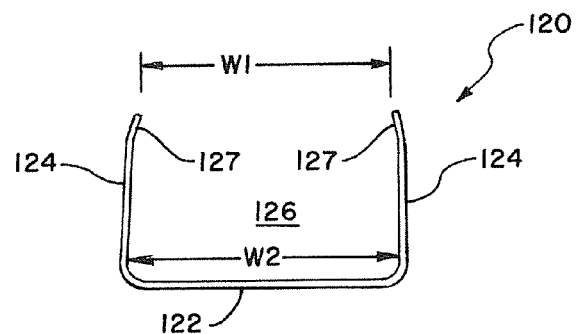
FIG. 4C is an elevation view of the retainer of FIG. 3A.

FIGS. 4A, 4B, and 4C illustrate a sealing element retainer 120 in accordance with an embodiment of the present disclosure. The sealing element retainer 120 may include a substantially flat base 122 and a pair of opposed side walls 124, which together form a channel 126. The side walls 124 are resiliently deformable from a normal, relaxed state, in which the channel entrance opening defined between the upper edges 127 of the walls has a normal width W1, to a deformed state in which the opening has a deformed width that is greater than W1, as explained further below. The channel 126 is configured to receive a portion of the sealing element 110, such that the ends of the fingers 130 protrude from the entrance opening of channel 126 of the seal retainer 120, as does the depressor 114.

FIG. 4C illustrates an end view of the sealing element retainer 120. As shown, the side walls 124 may be configured such that the channel 126 is wider near the base 122 than at the entrance opening defined between the opposed upper edges 127 of the side the walls 124. That is, the upper edges 127 of the side walls 124 define an entrance opening that, in the normal, relaxed state of the side walls 124, has the above-mentioned width W1 that is less than a base width W2. In some embodiments, the relaxed opening width W1 is less than the diameter D of the sealing element 110 (see FIG. 3). This enables the retainer 120 to receive the sealing element 110 when the side walls 124 are deformed, and to resiliently capture and retain the sealing element 110 within the channel 126 when the side walls 124 resiliently spring back toward their relaxed state.

Like the sealing element 110 described above, the width of the retainer 120 may also be selected according to the diameter of the sealing element 110 to be retained therein. For example, for a sealing element 110 having a diameter of 25 mm (i.e., a radius R of 12.5 mm, as shown in FIG. 3), the retainer 120 may be approximately 27 mm (1.07 in.) wide at the base (width W2), and approximately 23 mm (0.9 in.) wide between the upper edges 127 of side walls 124 (width W1). The height of the side walls 124 above the base 122 (that is, the distance between the base 122 and the upper edge 127 of each side wall 124) may advantageously be equal to, or slightly greater than, the radius R of the sealing element 110. Thus, in the aforesaid example, the side wall height would be at least about 12.5 mm, up to about 15 mm.

In the illustrated embodiment, the arc length of the fingers 130 exceeds the height of the side walls 124 of the seal retainer 120. In other embodiments, the arc length may be equal to or slightly less than the height of the retainer side walls 124.

Figure 2:
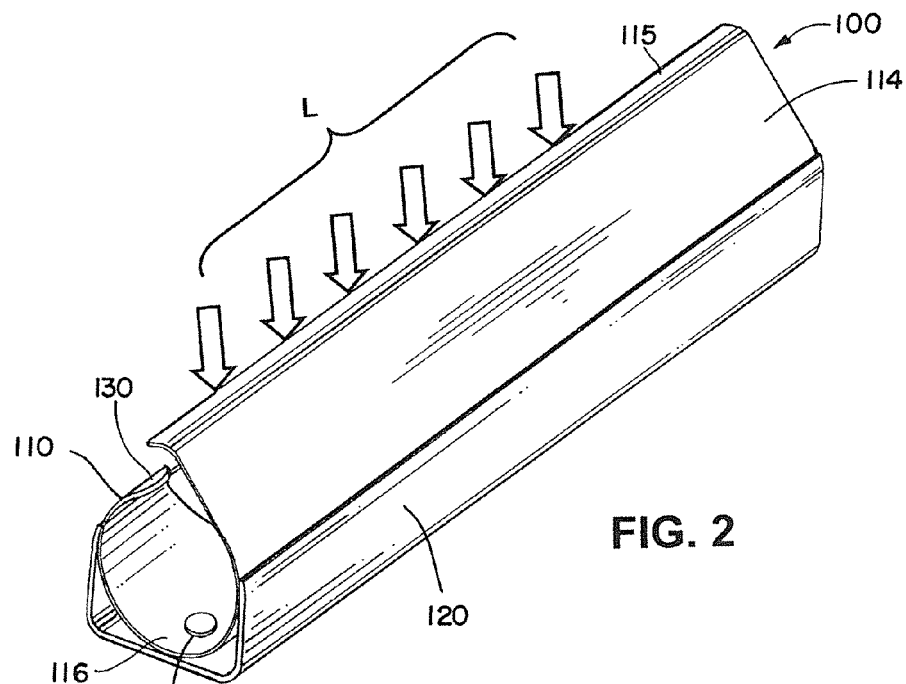
FIG. 2 is a top and rear perspective view of the seal assembly of FIG. 1.

As mentioned above, in some embodiments, the center portion 116 of the sealing element 110 may be provided with a linear array of apertures 105 (one of which is shown in FIG. 5) that register with apertures 128 in the retainer 120, as shown in FIGS. 3A and 3B, when the sealing element 110 is installed in the retainer 120. Thus, each of the apertures 105 of the sealing element 110 may be aligned with an aperture 128 of the retainer 120 to receive a fastener 129 (FIGS. 2 and 3), as described below, to fasten the sealing element 110 to the retainer 120, and thereby prevent the sealing element 110 from rotating within the retainer 120 when compressed. As shown in FIGS. 4A and 4B, the apertures 128 may advantageously be provided along a longitudinal centerline of the seal retainer 120. The position and number of the apertures 128 are exemplary only, and not limiting. Each of the apertures 128 may receive a fastener 129 to fix the seal element 110 to the seal retainer 120, as shown in FIGS. 2 and 3. For example, in some embodiments the fasteners 129 may be rivets, nuts, or another type of fastener. In one embodiment, the fasteners 129 are of the type sold under the trademark Hi-Lok® by Hi-Shear Corp. of Torrance, Calif. The fasteners 129 further secure the sealing element 110 within the seal retainer 120, preventing the sealing element 110 from rotating axially within the retainer 120 when, for example, the sealing element 110 is compressed or under a load. The fasteners 129 may also secure the retainer 120 to a host structure (not shown). In some embodiments, the fasteners 129 may be configured to protrude within the center portion 116 of the sealing element 110, as shown. In other embodiments, the fasteners 129 may be flush with the interior surface of the center portion 116.

Alternatively, the fasteners 129 may be employed only to fix the retainer 120 to a host structure, in which case the sealing element apertures 105 may be omitted. In this case, the sealing element 110 is fixed positionally within the channel 126 of the retainer 120 by the compression provided when the side walls 124 spring back toward their relaxed state against the sealing element 110. Furthermore, the radial distortion experienced by the sealing element 110 from the transmission of load forces to it through the depressor portion 114 tends to force the sealing element 110 against the side walls 124, thereby further securing the sealing element 110 within the retainer 120, and thus limiting or preventing the axial rotation of the sealing element 110 within the retainer 120.

FIGS. 1, 2, and 3 illustrate a seal assembly 100 in accordance with an embodiment of the present disclosure. As shown, the sealing element 110 is retained in the channel 126 of the retainer 120 when the side walls 124 of the retainer 120 resiliently return from their deformed state toward their relaxed state, as noted above. Because the diameter D of the sealing element 110 is slightly greater than the relaxed state width W1 of the side walls 124, the side walls 124 do not return completely to their relaxed state width W1, but rather are held by the sealing element 110 to a tension width W1' (FIG. 3) that is slightly greater than W1. The upper edges 127 of the side walls 124 are thereby held in tension by the sealing element 110, and thus capture and retain the sealing element 110 within the channel 126, so that a substantial portion of the sealing element 110 protrudes from channel 126.

As shown in FIG. 2, when the seal assembly 100 is installed, a load or compression force L is applied to the depressor portion 114, resulting in pressure on the sealing element 110. As discussed above, fasteners 129 may be inserted in the registering apertures (105, 128) of the sealing element 110 and the retainer 120 to fasten the sealing element 110 to the retainer 120 and to a host structure (e.g., aircraft engine nacelle). In some embodiments, as mentioned above, the fasteners 129 may be configured such that a head of a fastener may protrude inside the sealing element 110. For example, when a fastener of the type sold under the trademark Hi-Lok® is used, the fastener includes a head that protrudes inside the retainer 120, such that the head of the fastener engages the seal aperture 105 (which in some embodiments may comprise a divot or partial hole) when the sealing element 110 is installed in the retainer channel 126, thereby limiting or inhibiting the rotation of the seal element 110 within the seal retainer 120.

Figure 6A:
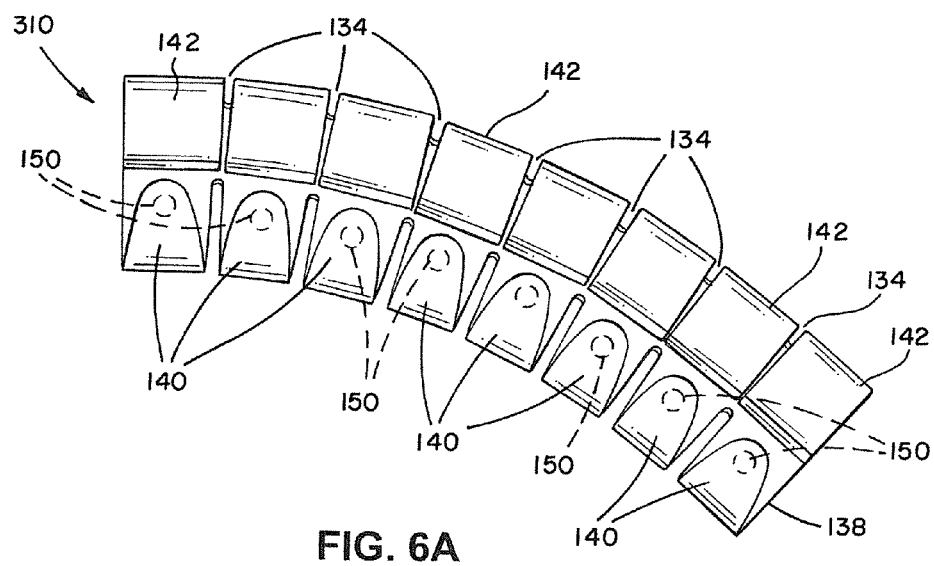
FIG. 6A is an elevation view of a sealing element in accordance with another embodiment of the present disclosure.
Figure 6B:
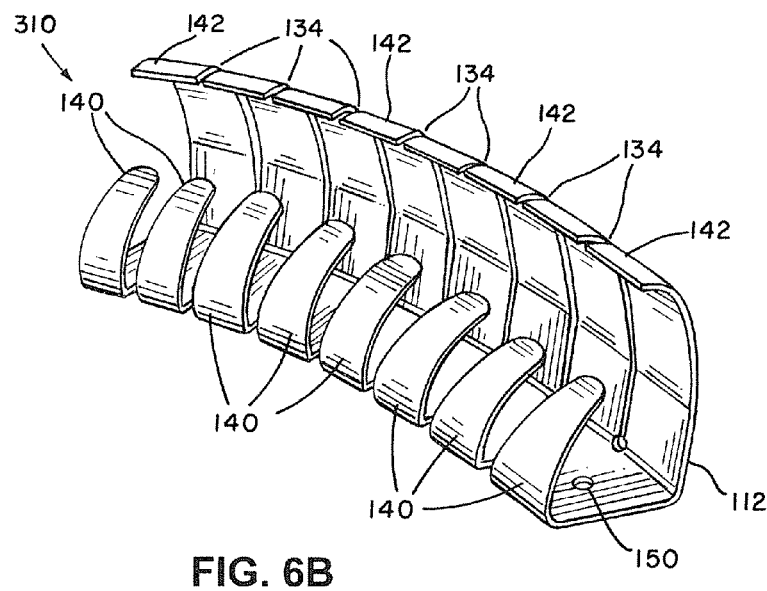
FIG. 6B is a perspective view of the sealing element of FIG. 6A.

FIGS. 6A and 6B illustrate a sealing element 310 in accordance with another embodiment of the present disclosure. The sealing element 310 is similar to the sealing element 110 shown in FIGS. 1, 2, 3, and 5, except that it is divided by a plurality of slots 134 into a plurality of axial segments that are connected to each other along a flexible axial spine 138 (FIG. 6A). As shown in FIG. 6B, each of the segments includes a curved flexible finger 140 and a depressor segment 142. The slots 134 permit the sealing element 310 to be more easily bent or curved relative to its longitudinal axis. As such, the sealing element 310 may be provided with different curvatures along its length according to the application for which it is to be used. For example, in some embodiments, the sealing element 310 may include both an unbent portion and a bent portion. In some embodiments, the sealing element 310 may be formed into a circular configuration.

As shown in FIGS. 6A and 6B, the sealing element 310 defines what may be called an "outside curve," in which the slots 134 between the depressor segments 142 tend to widen, spreading the depressor segments 142 further apart. In such a configuration, it may be advantageous to provide a second sealing element (not shown) coaxially disposed inside the sealing element 310, and rotationally oriented so that its fingers block the gaps 134. For example, the second or inner sealing element may advantageously be rotated 180° with respect to the first or outer sealing element 310. If the sealing element 310 is, instead, bent into what may be called an "inside curve," the gaps 134 between the depressor segments 142 tend to close, thereby obviating the need for a second or inner sealing element.

The sealing element 310 is configured for installation and retention in a conforming retainer (not shown) of conforming curvature along its longitudinal dimension. The sealing element 310 may be therefore configured with one or more apertures 150 that are located so as to align with registering apertures in the retainer to receive fasteners to fasten a seal assembly including the sealing element 310 to a host structure, as described above.

One aspect of a method for making a high temperature sealing assembly in accordance with the present disclosure includes: (a) providing a semi-tubular metal sealing element 110 including a linear array of arcuate resilient fingers 130 and a load-bearing or depressor portion 114 extending longitudinally along the sealing element 110 in opposition to the fingers 130 to receive a load; (b) installing the sealing element 110 into a channel 126 of a seal retainer 120, whereby the sealing element 110 is retained within the channel 126 with the depressor portion 114 external to the retainer; (c) and fastening the seal element 110 and the retainer 120 to a host structure. In this configuration, the depressor portion 114 is positioned to receive a load, thereby compressing the seal 110 within the seal retainer 120.

The above description presents the best mode contemplated for carrying out the present seal assembly, and of the manner and process of making and using it, in such full, clear, concise, and exact terms as to enable any person skilled in the art to which it pertains to make and use the seal assembly. The seal assembly is, however, susceptible to modifications and alternate constructions that are equivalent to those discussed above. Consequently, this disclosure is not limited to the particular embodiments described and illustrated herein. On the contrary, this disclosure encompasses all modifications and alternate constructions coming within the spirit and scope of the following claims, which particularly point out and distinctly claim the subject matter of this disclosure.

What is claimed is:

1. A seal assembly, comprising:
   a sealing element defining a longitudinal axis and comprising:
   a longitudinal center portion and first and second longitudinal side portions;
   an array of resilient arcuate fingers extending from the first longitudinal side portion and curving partially around the longitudinal axis of the sealing element; and
   a depressor portion extending from the second longitudinal side portion toward the arcuate fingers of the sealing element;
   a retainer defining a longitudinal channel in which the sealing element is retained and comprising:
   a longitudinal base; and
   first and second resiliently deformable opposed longitudinal side walls, each of the first and second side walls extending from the base to an upper edge, wherein the side walls and the base define the channel in which the sealing element is retained, and wherein the channel has an entrance opening defined between the upper edges of the first and second side walls;
   wherein the first and second side walls of the retainer are resiliently deformed by the sealing element retained in the channel; and
   wherein the sealing element is retained in the channel in a position in which the depressor portion and the arcuate fingers extend outside of the entrance opening in a position in which the depressor portion is configured to force the sealing element resiliently against the side walls of the retainer in response to a compressive load applied to the depressor portion, wherein once installed, the sealing element maintains the resilient deformation of the side walls without assistance.

2. The seal assembly of claim 1, wherein the channel has a width that decreases from the base toward the upper edges of the side walls.

3. The seal assembly of claim 1, wherein the channel has a relaxed width between the upper edges of the side walls and a resiliently deformed width between the upper edges of the side walls that is greater than the relaxed width, and wherein the sealing element has a diameter greater than the relaxed width.

4. The seal assembly of claim 1, wherein the sealing element is composed of a metal alloy material suitable for use at an operating temperature of at least about 260° C.

5. The seal assembly of claim 1, wherein the sealing element has a radius, and wherein each of the side walls has a height at least equal to the radius.

6. The seal assembly of claim 1, wherein the sealing element is formed from a unitary sheet of a metal alloy spring material.

7. The seal assembly of claim 6, wherein the metal alloy is primarily an austenitic nickel-chromium superalloy.

8. The seal assembly of claim 1, wherein the sealing element is divided into a plurality of axial segments joined along a flexible axial spine.

9. The seal assembly of claim 1, wherein the arcuate fingers have a first radius of curvature, and wherein the depressor portion has a second radius of curvature greater than the first radius of curvature.

10. The seal assembly of claim 1, wherein the depressor portion terminates in a free edge that overlies the longitudinal axis of the sealing element.

11. A seal assembly, comprising: a semi-tubular sealing element defining a longitudinal axis and having first and second longitudinal side portions, the first side portion being configured as a longitudinal array of arcuate fingers curving partially around the longitudinal axis, the second side portion being configured as a longitudinal depressor portion extending toward the array of arcuate fingers and having a free edge spaced radially and circumferentially from the fingers in the array; and a retainer comprising a base and a pair of resiliently deformable opposed side walls extending from the base, the base and the side walls defining a channel configured to retain the sealing element, wherein each of the side walls extends from the base to an upper edge, wherein the upper edges of the side walls define between them a channel entrance opening that has a first, relaxed width, and a second, resiliently deformed width when the sealing element is retained in the channel, the resiliently deformed width being greater than the relaxed width, and wherein the sealing element is retained in the channel in a position in which the depressor portion and the arcuate fingers extend outside of the channel entrance opening in a position in which the depressor portion is configured to force the sealing element resiliently against the side walls of the retainer in response to a compressive load applied to the depressor portion, wherein once installed, the sealing element maintains the channel entrance opening in the second resiliently deformed width without assistance.

12. The sealing assembly of claim 11, wherein the channel has a width that decreases from the base toward the upper edges of the side walls.

13. The seal assembly of claim 11, wherein the first and second longitudinal side portions extend from opposite sides of a center portion, and wherein the free edge of the depressor portion is approximately diametrically opposed to the center portion.

14. The seal assembly of claim 11, wherein the depressor portion is configured to transfer a load to the sealing element, whereby the sealing element is deformed radially in response to the load.

15. The seal assembly of claim 14, wherein the radial deformation of the sealing element secures the sealing element within the channel sufficiently to prevent axial rotation of the sealing element within the channel.

16. The seal assembly of claim 11, wherein the sealing element is composed of a metal alloy material suitable for use at an operating temperature of at least about 260° C.

17. The seal assembly of claim 11, wherein the sealing element has a radius, and wherein each of the side walls has a height approximately equal to the radius.

18. The seal assembly of claim 11, wherein the sealing element is formed from a unitary sheet of a metal alloy spring material.

19. The seal assembly of claim 18, wherein the metal alloy is primarily an austenitic nickel-chromium superalloy.

20. The seal assembly of claim 11, wherein the sealing element is divided into a plurality of axial segments joined along a flexible axial spine.

21. The seal assembly of claim 11, wherein the sealing element is fixed to the base of the channel so as to prevent axial rotation of the sealing element within the channel.

22. The seal assembly of claim 11, wherein the arcuate fingers have a first radius of curvature, and wherein the depressor portion has a second radius of curvature greater than the first radius of curvature.

23. The seal assembly of claim 11, wherein the sealing element has a diameter greater than the relaxed width of the entrance opening.

24. The seal assembly of claim 11, wherein the first and second side walls are resiliently deformed by the sealing element retained in the channel.

25. The seal assembly of claim 11, wherein the free edge of the depressor portion overlies the longitudinal axis of the sealing element.

26. A method of making a seal assembly, comprising: (a) providing a sheet of high spring strength, high temperature metal alloy having first and second opposed side edges; (b) forming a semi-tubular sealing element by: (b)(1) forming a first portion of the sheet including the first side edge into a linear array of fingers; (b)(2) bending the fingers partially around a longitudinal axis to form a linear array of arcuate fingers; and (b)(3) forming a depressor portion by bending a second portion of the sheet including the second side edge toward the array of arcuate spring fingers so that the second side edge overlies the longitudinal axis and is spaced radially and circumferentially from the arcuate fingers; (c) providing a sealing element retainer comprising a base and a pair of resiliently deformable opposed side walls extending from the base, the base and the side walls defining a channel configured to retain the sealing element, the channel having an entrance opening defined between the side walls and having a relaxed width and a resiliently deformed width greater than the relaxed width; and (d) installing the sealing element into the channel with the depressor portion and the arcuate fingers extending outside entrance opening of the channel, whereby installing the sealing element forces the entrance opening of the channel from its relaxed width to its deformed width, and whereby once installed, the sealing element maintains the channel entrance opening in the resiliently deformed width without assistance.

27. The method of claim 26, wherein the sealing element retainer is made of the same metal alloy as the sealing element.

28. The method of claim 26, wherein the depressor portion is configured to transfer a load to the sealing element, whereby the sealing element is compressed radially in response to the load.

29. The method of claim 26, wherein the sealing element has a diameter that is greater than the relaxed width of the entrance opening, and wherein the step of installing includes resiliently spreading the side walls apart to the deformed width to permit entry of the sealing element into the channel, and then allowing the side walls to resiliently return to the relaxed width.

30. The method of claim 27, wherein the metal alloy is an alloy that is suitable for use at an operating temperature of at least about 260° C.

31. The method of claim 26, wherein the sealing element has a radius, and wherein each of the side walls has a height approximately equal to the radius.

32. The method of claim 30, wherein the metal alloy is primarily an austenitic nickel-chromium superalloy.

33. The method of claim 26, wherein the step of installing includes fixing the sealing element to the retainer.

34. The method of claim 26, wherein the arcuate fingers are bent so as to have a first radius of curvature, and wherein the second portion of the sheet is bent to form a depressor portion that has a second radius of curvature greater than the first radius of curvature.

* * * * *